United States Patent [19]

Germer

[11] Patent Number: 4,598,248

[45] Date of Patent: Jul. 1, 1986

[54] TEST OPERATION OF ELECTRONIC DEMAND REGISTER

[75] Inventor: Warren R. Germer, Dover, N.H.

[73] Assignee: General Electric Company, Somersworth, N.H.

[21] Appl. No.: 599,735

[22] Filed: Apr. 12, 1984

[51] Int. Cl.[4] .................. G01R 11/64; G01R 35/04
[52] U.S. Cl. .................... 324/103 R; 324/74
[58] Field of Search .................. 324/103 R, 74

[56] References Cited

U.S. PATENT DOCUMENTS

| | | | |
|---|---|---|---|
| 3,586,974 | 6/1971 | Ham | 324/103 R |
| 4,179,654 | 12/1979 | Germer | 324/103 R X |
| 4,197,582 | 4/1980 | Johnston et al. | 364/483 |
| 4,229,795 | 10/1980 | Vieweg | 364/483 |
| 4,283,772 | 8/1981 | Johnston | 364/900 |
| 4,301,508 | 11/1981 | Anderson et al. | 364/483 |
| 4,361,872 | 11/1982 | Spalti | 324/76 R X |
| 4,368,519 | 1/1983 | Kennedy | 377/19 |
| 4,415,853 | 11/1983 | Fisher | 324/74 |
| 4,467,434 | 8/1984 | Hurley et al. | 324/103 R X |

FOREIGN PATENT DOCUMENTS 2633182 1/1978 Fed. Rep. of Germany ... 324/103 R

Primary Examiner—Jerry W. Myracle
Assistant Examiner—Stephen M. Baker
Attorney, Agent, or Firm—Robert E. Brunson; Thomas R. Morrison

[57] ABSTRACT

An electronic demand register performs rolling demand metering in which a demand interval is divided into N subintervals. At the end of each subinterval, the demand data from the just-completed subinterval is summed with the demand in the most-recent N−1 contiguous subintervals to derive an interval demand. A test operation is provided in which the stored maximum demand, a number representing the remainder of the subinterval interrupted by the test and programmed constants are stored in non-volatile memory but are also retained in the processor for use during test. A test reset switch resets accumulated demand data and presets the subinterval timer to predetermined values from which they may be operated by a calibrated test load to confirm the performance of the demand register. At the end of testing, all data in the processor is zeroed and the data stored in non-volatile memory is restored. Demand metering is resumed starting with the remainder of the interrupted subinterval and with the demand from the N−1 prior subintervals set to zero.

7 Claims, 5 Drawing Figures

TEST OPERATION OF ELECTRONIC DEMAND REGISTER

BACKGROUND OF THE INVENTION

The present invention relates to electric meters and, more particularly, to apparatus and method for providing test operation for electronic demand registers of electric meters.

Conventional electric meters employ an aluminum disk driven as a rotor of a small induction motor by an electric field at a speed which is proportional to the electric power being consumed by a load. Geared dials or cyclometer discs integrate the disk motion to indicate the total energy consumed, conventionally measured in kilowatt hours (one kilowatt hour equals one thousand watts of power consumption for one hour).

In addition to the above measurement of consumption, some electric meters contain demand registers having means for separating the consumption into those parts of consumption occurring during peak and off-peak hours (however defined) and for recording maximum demand during a predetermined period of time in order to adjust billing according to such parameters. In one such meter disclosed in U.S. Pat. No. 3,586,974, a mechanical demand register records the power usage during a predetermined period of time and stores the value for reading. The predetermined period of time may be, for example, the time between meter readings, or a period of time corresponding to the billing period of the utility providing the power. A clockwork mechanism restarts the demand register at regular intervals of, for example, a fraction of an hour, so that, at the end of the predetermined period, the stored value represents the highest value of power usage occurring during any one of the regular intervals in the predetermined period.

Demand registers of the mechanical type, such as disclosed in the above U.S. Patent, have limited flexibility. Once their design is completed for a particular meter physical configuration, the design is not transferrable to a meter having a different physical configuration. Also, the demand-measurement functions cannot be redefined without major mechanical redesign.

When test operation of a mechanical demand meter in the field is desired, there is some question whether such test operation can be performed while abiding by the regulations for demand metering as defined by the commissions having jurisdiction over the utility providing the electric power. Alternatively, if the mechanical demand register is reset in a manner which satisfies the definitions for demand metering, an excessive amount of billing information, with its revenue, may be lost.

Maximum demand metering is conventionally defined as the maximum amount of power consumed in any one contiguous time period during the time interval of interest; that is, the maximum amount of power consumed in any one of the periods of, for example, 15 minutes, 30 minutes or one hour. If test operation is begun in one of such time periods, and the accumulation of actual usage during the time period is paused until the end of the test operation and then resumed, the demand accumulated at the end of the interrupted time period consists of an initial portion before the test interruption and a final portion following the test interruption. The intervention of the test interruption appears to violate the definition of demand metering.

From a practical standpoint, a test interruption may have a significant influence on the reading on the demand register at the end of the interrupted interval. If, for example, power usage during the test interruption would have been very low and power usage in the final portion is, in fact, very high, the high usage in the final portion, added to the usage in the initial portion may rise to a value which remains stored as the maximum demand for the billing period even though the user, except for the test interruption, would not have consumed such a large amount of power in any one contiguous time period.

Conversely, if the final portion is a period of abnormally low usage compared to the usage which would have been recorded during the test interruption, this low usage, when combined with the usage during the initial portion, represents a reduction in billing.

In addition to the above limitations of mechanical demand metering, a useful demand metering technique known as rolling demand is not practically feasible using mechanical demand registers. In rolling demand metering, a demand interval is divided into N contiguous subintervals. The usage during each demand subinterval is summed with the demand recorded during the preceding $N-1$ subintervals. At the end of each subinterval, the total demand recorded is the demand for N subintervals, i.e. for the entire preceding demand interval. The maximum demand may then be taken as the maximum over any interval sensed at the end of a subinterval. The use of such rolling demand metering avoids distortion in the billing data which could otherwise occur due to short-term extremes in the usage data which would otherwise become lost in the averaging process over an entire demand interval.

Greater flexibility in demand metering may be obtainable using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the demand during defined periods of time.

An electronic processor of an electronic demand register conventionally employs volatile random access memory for the high speed and low power consumption characteristics offered by such devices. However, several events can occur during normal and emergency operation of an electric meter containing an electronic demand register which can threaten the integrity of data being recorded for billing purposes in volatile random access memory. If a power outage, by removing power from the processor and the random access memory, were allowed to erase all data stored in random access memory, then the billing data contained in the erased data would be lost. This is, of course, unacceptable. U.S. patent application Ser. No. 599,736, filed on the same date as the present application, discloses means for storing data in non-volatile memory when a power outage occurs and for ignoring or tolerating certain normal deviations of the line power, such as, for example, momentary overvoltage, surges, noise and momentary power outages enduring for a very short time period. This new capability to store billing data and programmed constants in non-volatile memory permits re-thinking the manner in which test operation may be performed and the way in which demand data accumulated before and after a test interruption may be handled so as to provide fairness both to the consumer and to the utility.

OBJECTS AND SUMMARY OF THE INVENTION

Accordingly, it is an object of the invention to provide an electronic demand register having apparatus and method for permitting test operation which overcomes the drawbacks of the prior art.

It is a further object of the invention to provide an electronic demand register of the type employing a digital processor and a random access memory which includes means for storing volatile data in a non-volatile storage medium during a test operation and for retrieving the data from the non-volatile storage medium and resuming normal operation following the test operation in a manner which retains relevant billing data accumulated before the test operation.

It is a still further object of the invention to provide an electronic demand register having means for resuming normal operation following a test interruption in a manner which satisfies the definition of demand metering and provides fair treatment both to the user and the utility.

Briefly stated, the present invention provides an electronic demand register capable of performing rolling demand metering in which a demand interval is divided into N subintervals. At the end of each subinterval, the demand data from the just-completed subinterval is summed with the sum of the demands in the most-recent N−1 contiguous subintervals to derive an interval demand. A test operation is provided in which the stored maximum demand, a number representing the remainder of the subinterval interrupted by the test, and a set of programmed constants are stored in non-volatile memory and are also retained in the processor for use during testing. A test reset switch resets accumulated demand data and presets the subinterval timer to predetermined values from which they may be operated by a calibrated test load to confirm the performance of the demand register or to aid in its calibration. At the end of testing, all data in the processor is zeroed and the data stored in non-volatile memory is restored. Demand metering is resumed starting with the remainder of the interrupted subinterval with the demand from the N−1 prior subintervals set to zero.

According to an embodiment of the invention there is provided apparatus for providing an operating mode and a test mode for an electronic demand register of an electric meter, the electronic demand register including a digital processor of the type having a volatile memory comprising means for non-volatile storage of at least a maximum demand, a remainder of a demand time period and a plurality of programmed constants upon entering the test mode, means for retaining at least the programmed constants in the volatile memory upon entering the test mode whereby the digital processor is enabled to use the programmed constants during the test mode, means for presetting a demand time period and at least one of a demand accumulator and a maximum demand storage for initiation of a test, and means for erasing the demand accumulator and the maximum demand storage and for restoring the maximum demand, the remainder of a demand time period and the programmed constants stored in non-volatile memory into the volatile memory upon entering the operating mode from the test mode whereby demand metering resumes from zero accumulated demand for the remainder of the demand time period before beginning to accumulate a demand over a full demand time period.

According to a feature of the invention there is provided a method for providing an operating mode and a test mode for an electronic demand register of an electric meter, the electronic demand register including a digital processor of the type having a volatile memory comprising storaging at least a maximum demand, a remainder of a demand time period and a plurality of programmed constants in a non-volatile memory upon entering the test mode, retaining at least the programmed constants in the volatile memory upon entering the test mode whereby the digital processor is enabled to use the programmed constants during the test mode, presetting a demand time period and at least one of a demand accumulator and a maximum demand storage for initiation of a test, and erasing the demand accumulator and the maximum demand storage and restoring the maximum demand, the remainder of a demand time period and the programmed constants stored in non-volatile memory into the volatile memory upon entering the operating mode from the test mode whereby demand metering resumes from zero accumulated demand for the remainder of the demand time period before beginning to accumulate a demand over a full demand time period.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including, for example, single phase or polyphase meters with one or more current and voltage coils, for concreteness, the detailed description which follows is directed toward an illustrative example of a 2-wire single phase meter of the type having a single current coil and a single voltage coil.

Figure 1:
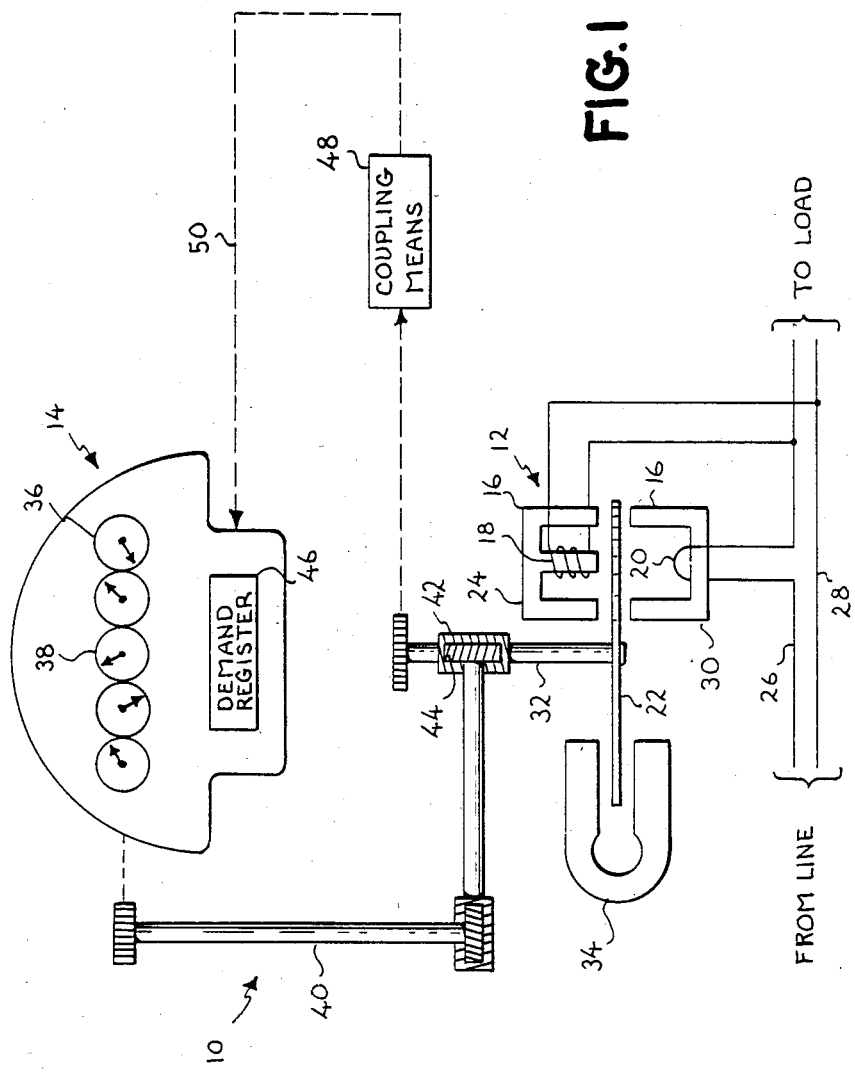
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power, consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, engaging and rotating a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed period of time by a pusher mechanism (not shown). The pusher mechanism is reset and restarted at the end of each of the fixed periods of time, leaving the indicating devices with an indication proportional to the power usage (the demand) during the fixed period of time. The indication on the indicating devices at any time is, therefore, the highest demand which has occurred during any one of the time periods since the last time the indicating devices were reset. The recorded demand is employed in billing.

When test operation is initiated in such a mechanical demand register 46, in order to avoid billing the user for an artificial demand which may be generated during the test operation, the gearing of mechanical demand register 46 may be disengaged or the readings on the mechanical dials of demand register 46 may be recorded prior to beginning the test operation. At the end of the test operation, the gearing is re-engaged or the dials and gear train are mechanically rolled back to the positions they had at the beginning of the test operation and demand metering may be resumed from the same position within the demand metering interval and demand metering is continued from the same demand readings which existed at the beginning of the test operation. As previously noted, this practice may fail to rigorously satisfy the definition of demand metering and may also impose an unfair burden either on the user or on the utility.

In the present invention, demand register 46 is an electronic demand register.

Figure 2:
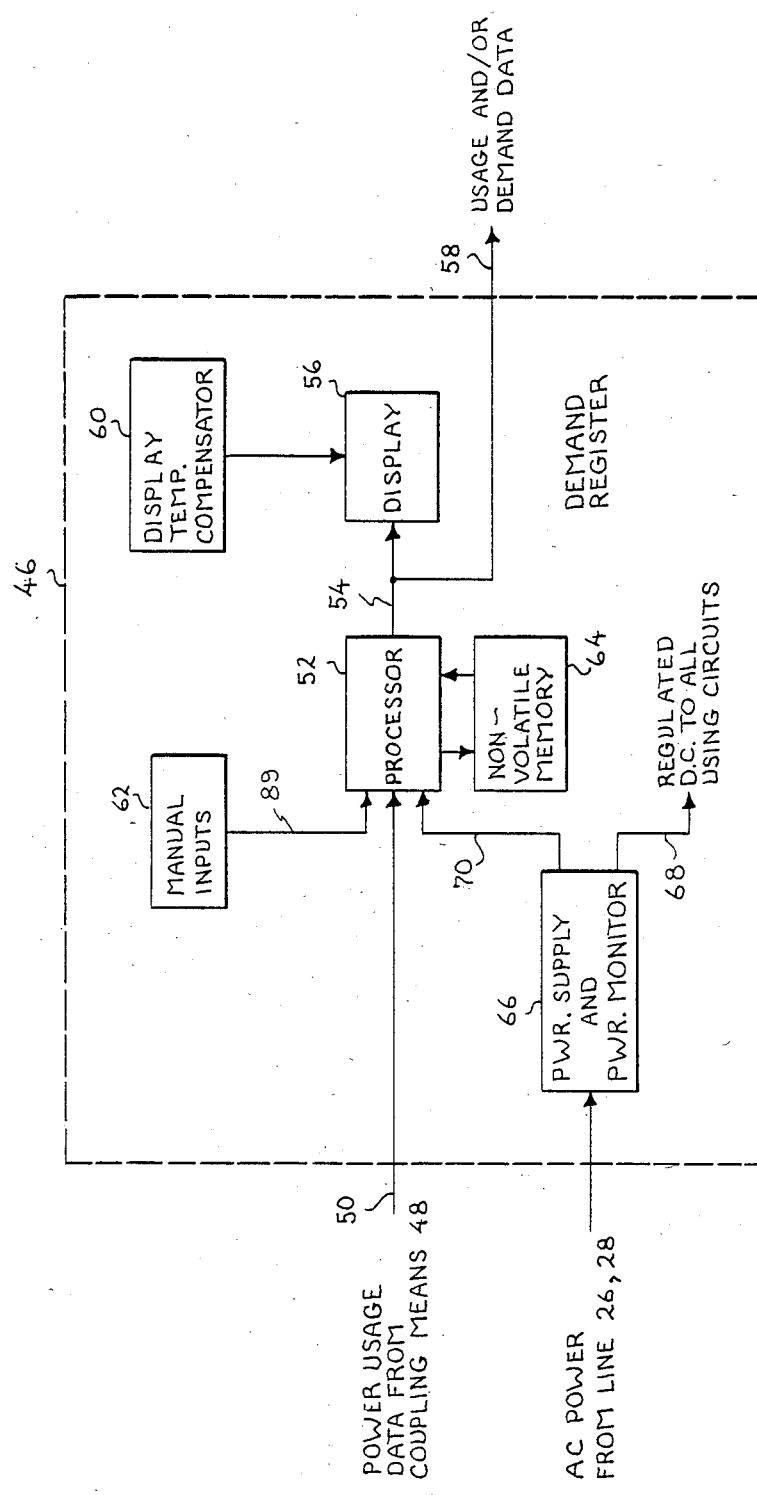
FIG. 2 is a block diagram of a demand register of FIG. 1 according to an embodiment of the invention.

Referring to FIG. 2, there is shown a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency or pulse repetition rate, which is variable in dependence on the rate of power usage. Any suitable electronic signal generating apparatus, such as, for example, an apparatus such as one of those disclosed in the referenced prior patents, may be employed to produce a power usage signal which is applied on a line 50 to a processor 52 in demand register 46. Processor 52 appropriately performs calculations on the usage data, such as, for example, counting pulses and scaling, to derive desired demand parameters and stores the result. In addition, processor 52 may provide an output on a line 54 suitable for driving a display 56. The stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

The data which processor 52 transmits for display and/or the manner in which processor 52 operates on the input data to produce internally stored values may be modified according to a manual input 62 for changing the operating mode of demand register 46 or the data displayed on display 56 as will be further detailed hereinafter.

As previously stated, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally employ serial reading and writing. This provides relatively slow memory access times on the order of 10 or 20 milliseconds. This is too slow for most applications. Besides this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. The volatile memory elements in processor 52 must, of course, be written and erased many thousands of times a day. Thus, an electrically erasable programmable read only memory would have a very short life as the operating memory for processor 52.

In order to provide safe storage for data and/or programmed constants during a power outage or during test operation, a conventional non-volatile memory 64 is provided into which such data and constants can be written in the event of a power outage and during test operation and from which the data and constants can again be read upon restoration of normal conditions. In their role in non-volatile memory 64, electrically erasable programmable read only memory elements are erased and rewritten only when a relatively serious power outage occurs and during a relatively small number of test cycles as will be explained. Such operations are not expected to occur on a frequent enough basis in demand register 46 of electric meter 10 to represent a limit on the life of the register.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to detected conditions indicating the possibility or actuality of a power outage, applies control signals on a line 70 to processor 52 which controls the transfer of data from processor 52 to non-volatile memory 64 in the event of an apparent power outage and resets processor 52 in the event of an actual power outage. Prior to transferring the data and programmed constants to non-volatile memory 64, processor 52 checks to determine whether the demand during the current interval up to the time of the power outage exceeds the maximum demand previously recorded. If the demand in the current interval does exceed the maximum demand, the demand for the current interval is substituted for the maximum demand and the thus-modified data is transmitted to non-volatile memory 64 for storage. A full disclosure of the structure and function of power supply and power monitor 66 is contained in U.S. patent application Ser. No. 599,736, filed 4/12/84 which is herein incorporated by reference.

The present invention is best described in terms of four operating conditions:
(1) normal operation
(2) transition from normal operation to test operation
(3) test operation
(4) transition from test operation to normal operation Referring now to FIG. 3, in normal operation, a subinterval timing down counter 72 in a demand data accumulator 73 is preset to a predetermined value at the beginning of each subinterval from which it is counted down to zero by a clock signal having a predetermined frequency fed to it on a line 74. Due to the ready availability of a stable power line frequency of 50 or 60 Hertz in meter service, the predetermined frequency of the clock signal is preferably either the power line frequency itself on line 74 or a frequency which may be derived from the power line frequency by, for example, counting down or phase locking. A count in a subinterval demand counter 76 is zeroed at the beginning of each subinterval by a reset signal fed on a line 82 to a reset input R. While subinterval timing down counter 72 counts down, the cycles of the power usage signal on line 50 are accumulated in subinterval demand counter 76. As the count in subinterval timing down counter 72 reaches zero, an enable signal on a line 78 enables the storage of the accumulated subinterval demand from subinterval demand counter 76 in an interval demand counter 80. After the accumulated subinterval demand from subinterval demand counter 76 is stored in interval demand counter 80, the reset signal is applied on line 82 from subinterval timing down counter 72 to the reset input R of subinterval demand counter 76. The reset signal again resets the number, or count, in subinterval demand counter 76 to a predetermined value such as, for example, zero. At the same time, subinterval timing down counter 72 is again preset to the predetermined value from which it is counted down to zero over the next subinterval by the predetermined frequency.

Interval demand counter 80 adds the demand value of the current subinterval to the sum of the demand values of the preceding $N-1$ subintervals to derive a value for the interval demand in the entire N preceding subintervals making up an interval. The interval demand from the immediately preceding interval is applied on a line 84 to a maximum demand storage 86. If the newly received interval demand exceeds the maximum interval demand previously stored in maximum demand storage 86 since the last reset, maximum demand storage 86 discards the previous maximum value and stores the newly received interval demand as the new maximum demand against which the demand from succeeding intervals are compared. Interval demand counter 80 thereupon discards the subinterval demand from the oldest of the N subintervals so that the remaining stored value in interval demand counter 80 again represents the demand from the $N-1$ most recent subintervals.

Figure 3:
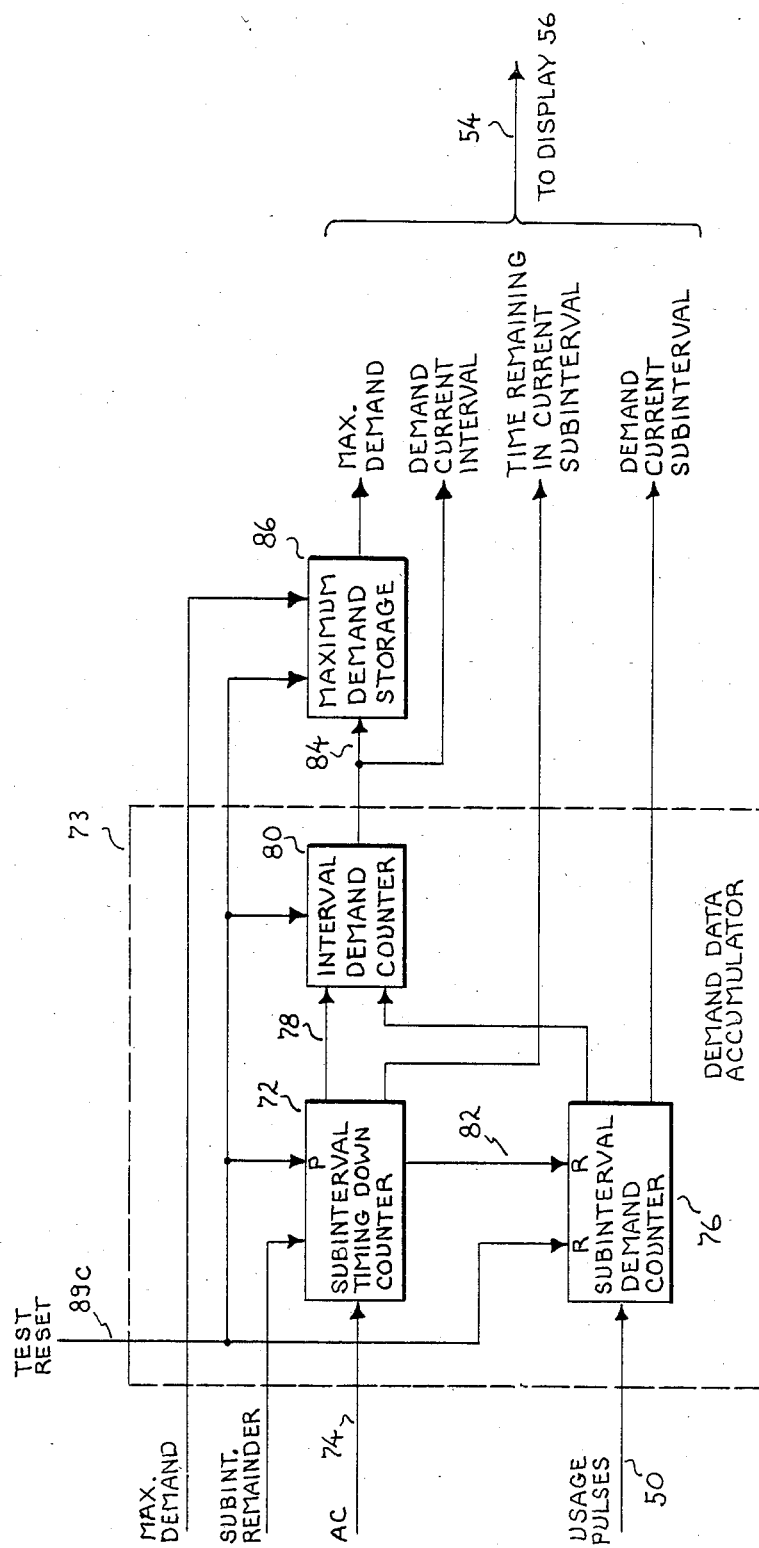
FIG. 3 is a block diagram of a demand data accumulator and maximum demand storage for the demand register of FIG. 2.

At least some of the data stored in the apparatus of FIG. 3 may be transmitted on line 54 to display 56.

Figure 4:
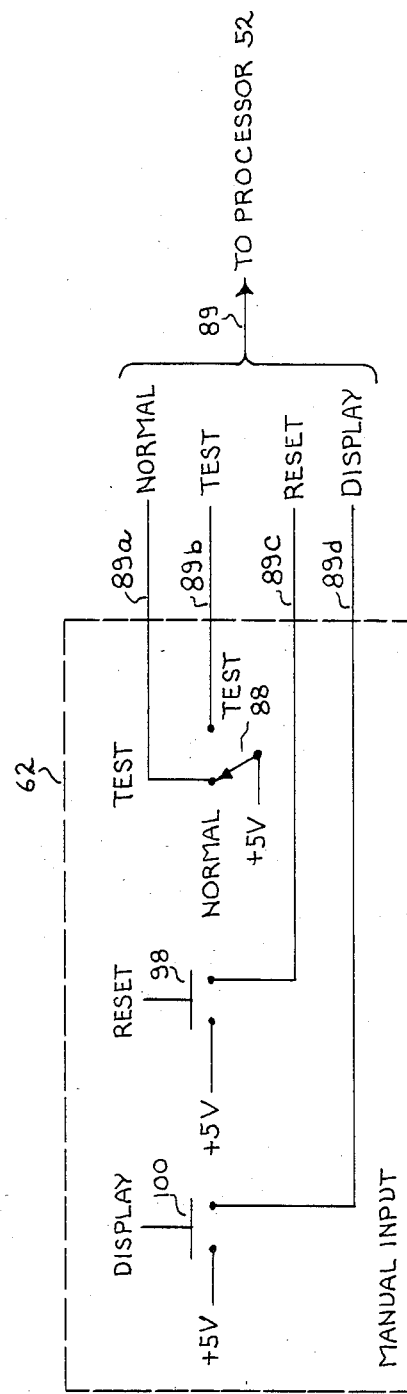
FIG. 4 is a schematic diagram of the manual input of FIG. 2.
Figure 5:
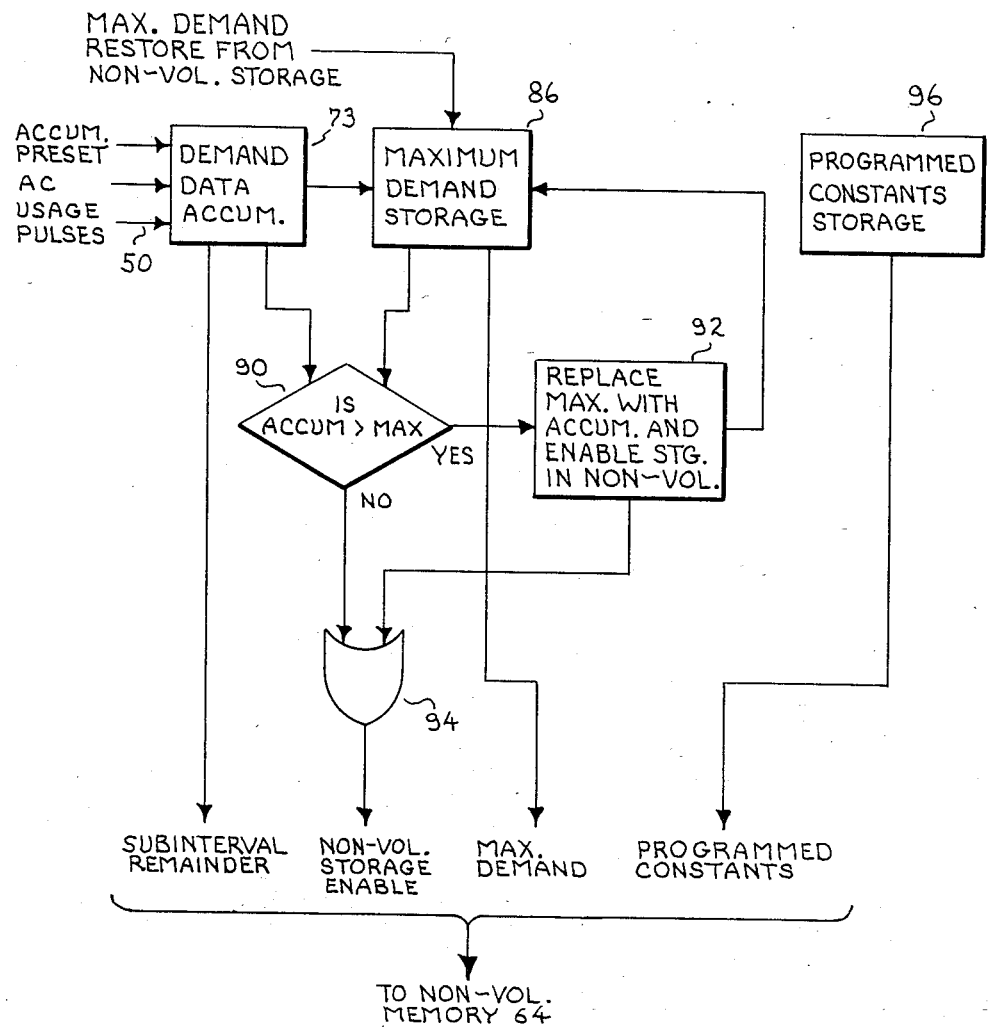
FIG. 5 is a combined logic and flow diagram of a test initiate sequence according to an embodiment of the invention.

Referring now to FIG. 4, manual input 62 is seen to contain a test switch 88 having a normal position and a test position. When test switch 88 is placed in its normal position, a signal on a line 89a enables processor 52 to accumulate demand and maximum demand data as previously described. When test switch 88 is placed in its test position, a signal on a line 89b enables processor 52 to enter a test mode. Upon entering the test mode, processor 52 performs a test-initiate sequence to prepare for the testing to follow. A combined logic and flow diagram of a suitable test-initiate sequence is shown in FIG. 5.

Upon receiving the test signal from manual input 62, a comparator 90 determines whether the demand data in demand data accumulator 73, including demand in the current fragment of a subinterval accumulated to the instant of the generation of the test signal, exceeds the previous maximum demand stored in maximum demand storage 86. If comparator 90 indicates that the current demand data exceeds the previous maximum demand, a logic element 92 enables replacement of the previous maximum demand with the current content of demand data accumulator 73 and also produces a non-volatile storage enable signal which is applied through an OR gate 94 to non-volatile memory 64. If the stored maximum demand in maximum demand storage 86 exceeds the current demand in demand data accumulator 73, an enable signal from comparator 90 is applied through OR gate 94 to enable storage of the data in non-volatile memory 64. When non-volatile memory 64 receives the non-volatile storage enable signal it enables erasure of all previously stored data and storage therein of the maximum demand from maximum demand storage 86, the timing count remaining in subinterval timing down counter 72, the subinterval demand data from subinterval demand counter 76 for the completed portion of the interrupted subinterval and the programmed constants normally stored in a programmed constant storage 96. Although the above data is written in non-volatile memory 64, it is not erased from the storage devices of FIGS. 3 and 5, but instead is preserved therein for use during the subsequent testing. This is particularly true of the programmed constants stored in programmed constant storage 96 which may be used to control demand register 46 during testing and may themselves be tested and verified during testing.

For purposes of testing, electric meter 10 may be removed from its normal position in series with the load (not shown) and instead may be connected to a conventional calibrated test load which a tester may use to apply known loads and demands to electric meter 10 and compare the resulting demand data in demand register 46 accumulated during the test with the known demand imposed by the test load.

Referring again to FIG. 4, manual input 62 contains a momentary contact reset switch 98 and a momentary contact display switch 100 effective for producing a reset signal and a display signal on line 89c and line 89d respectively. Referring also to FIG. 3, when reset switch 98 is actuated to produce a test signal while test switch 98 is in the test position, reset and/or preset signals are applied to subinterval timing down counter 72, subinterval demand counter 76, interval demand counter 80 and maximum demand storage 86 to reset or preset the contents of these elements to predetermined known conditions for the initiation of a test. Although the predetermined known conditions may be arbitrarily chosen, in the preferred embodiment it is convenient to preset subinterval timing down counter 72 to its normal starting value which may be counted down to zero during a normal-length subinterval using the normal clocking frequency and to reset subinterval demand counter 76, interval demand counter 80 and maximum demand storage 86 to zero. Scaling and other control of processor 52 is performed by the programmed constants which, although they are stored in non-volatile memory 64 at the initiation of the test mode, are also retained in processor 52 for use during testing.

Each time reset switch 98 is actuated while in the test mode, the above-described preset and/or reset is performed. Thus, a tester is enabled to start a new test subinterval or interval coincident with a desired point in time and may end a portion of a test and begin a new test period from known conditions by again actuating reset switch 98.

In the preferred embodiment of the invention, the programmed constants define the data which may be displayed and the response of processor 52 and display 56 to actuation of display switch 100. The programmed constants may provide for the display of different data in normal and test modes or may provide for the display of at least some of the same data but in different ways in the two modes. In one technique, actuation of display switch 100 in normal mode causes the scrolling of a full cycle of a predetermined set of data on display 56 with each data item remaining displayed for a predetermined display period of, for example, about 7 seconds. In this technique, actuation of display switch 100 in the test mode may step processor 52 and display 56 to display the next data element which thereupon remains constantly available on display 56 until display switch 100 is again actuated to produce constant display of the next data item or until the test mode is exited by returning test switch 88 its normal position at the end of the test.

At the end of the test, test switch 88 is returned to the normal position. The resulting signal on line 89a enables the erasure of all data in the volatile memory elements of processor 52 and the restoration therein of the demand and timing data and the programmed constants which were transferred to non-volatile memory 64 at the beginning of the test. In this way, any demand data generated during test and stored in processor 52 is eliminated and any modification of the programmed constants which may have resulted from the test operation is corrected.

Referring again to FIG. 3, the demand data which is restored in processor 52 includes the number representing the remainder of the interrupted subinterval which is restored in subinterval timing down counter 72 and the maximum demand which is restored in maximum demand storage 86. Subinterval demand counter 76, and interval demand counter 80 are zeroed upon the restoration of normal operation. Subinterval timing down counter 72 is counted down from the remainder number stored in it while the usage pulses are accumulated, starting at zero, in subinterval demand counter 76. When subinterval timing down counter 72 is counted down to zero, the demand value then contained in subinterval demand counter 76 is transferred to interval demand counter 80 where it is added to the demand value for the preceding N−1 subintervals (all of which are zero at this time). This value for sum of the N−1 blank subintervals plus the demand in the remainder of the interrupted subinterval is applied to maximum demand storage 86 for comparison with the stored maximum demand as previously described. Following the comparison, the demand for the oldest subinterval stored in interval demand counter 80 (which is zero at this time) is deleted in preparation for the summing operation at the end of the ensuing subinterval. It is only after a full N subintervals have elapsed after the end of the interrupted subinterval that full demand metering based on actual demand during a full set of N contiguous subintervals is performed. From that point, normal subinterval demand accumulation, addition with the most recent N−1 subinterval demands and comparison of the result with the maximum stored demand is carried out as previously described.

The demand metering and test operation may be performed with any suitable apparatus including, for example, discrete components, digital, analog or digital-/analog hybrid circuits. In a digital implementation of the present invention, use may be made of a main-frame computer, a minicomputer or a microprocessor. In the preferred embodiment of the invention, processor 52 is a microprocessor and may be, for example, of the type sold commercially by NEC under the designation uPD7503. Although they are illustrated as separate logic functions, appropriate ones of the functions illustrated in FIGS. 3 and 5 may preferably be performed by the microprocessor without departing from the spirit and scope of the invention.

In the manner described hereinabove, rolling demand metering with an electronic processor accommodates the use of a test mode without losing previously stored maximum demand data or unfairly penalizing either the energy consumer or the utility for errors in demand resulting from the test interruption of demand accumulation. In addition, resumption of normal operation is provided for in a manner which permits demand accumulation to begin from zero in the point in a subinterval corresponding to the point at which the subinterval was interrupted for the test. This technique fully satisfies the definition of demand metering in a way which may not be fully accommodated by mechanical demand metering.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for providing an operating mode and a test mode for an electronic demand register of an electric meter, said electronic demand register including a digital processor of the type having a volatile memory, comprising:

means for non-volatile storage of at least a maximum demand, a remainder of a demand time period and a plurality of programmed contants upon entering said test mode;

means for retaining at least said programmed constants in said volatile memory upon entering said test mode whereby said digital processor is enabled to use said programmed constants during said test mode;

means for presetting a demand time period and at least one of a demand accumulator and a maximum demand storage for initiation of a test; and means for erasing said demand accumulator and said maximum demand storage and for restoring said maximum demand, said remainder of a demand time period and said programmed constants stored in non-volatile memory into said volatile memory upon entering said operating mode from said test mode whereby demand metering resumes from zero accumulated demand for said remainder of said demand time period before beginning to accumulate a demand over a full demand time period.

2. Apparatus according to claim 1 wherein said electronic demand register includes a rolling demand register, in which a demand interval is divided into N contiguous subintervals, said demand time period being said subinterval and said demand accumulator including a subinterval demand counter and an interval demand counter, said subinterval demand counter being effective for accumulating a demand over a subinterval, said interval demand counter being effective for containing a demand from a set of $N-1$ most recent subintervals, at an end of each subinterval, said interval demand counter being effective to sum a subinterval demand from said subinterval demand counter with said demand from said set of $N-1$ most recent subintervals, and means for replacement of said maximum demand with said sum if said sum exceeds said maximum demand.

3. Apparatus according to claim 2 wherein said means for non-volatile storage includes means effective to produce a test-entry sum, a demand from a subinterval interrupted by a beginning of a test mode with said demand from said $N-1$ most recent subintervals, said means for replacement being effective for replacing said maximum demand with said test-entry sum before said means for non-volatile storage stores said maximum demand if said test-entry sum exceeds said maximum demand.

4. Apparatus according to claim 2 wherein said demand accumulator includes a subinterval timing down counter, means for presetting includes means for presetting a predetermined value in said subinterval down counter, said subinterval down counter being effective for counting down from said predetermined value to zero in said subinterval, a value remaining in said subinterval down counter at a beginning of said test mode being said remainder of a demand time period.

5. Apparatus according to claim 4 wherein said means for presetting further includes means for resetting at least said subinterval demand counter to a second predetermined value.

6. Apparatus according to claim 5 wherein said second predetermined value includes zero.

7. A method for providing an operating mode and a test mode for an electronic demand register of an electric meter, said electronic demand register including a digital processor of the type having a volatile memory, comprising:

storaging at least a maximum demand, a remainder of a demand time period and a plurality of programmed constants in a non-volatile memory upon entering said test mode;

retaining at least said programmed constants in said volatile memory upon entering said test mode whereby said digital processor is enabled to use said programmed constants during said test mode;

presetting a demand time period and at least one of a demand accumulator and a maximum demand storage for initiation of a test; and erasing said demand accumulator and said maximum demand storage and restoring said maximum demand, said remainder of a demand time period and said programmed constants stored in non-volatile memory into said volatile memory upon entering said operating mode from said test mode whereby demand metering resumes from zero accumulated demand for said remainder of said demand time period before beginning to accumulate a demand over a full demand time period.

* * * * *